United States Patent [19]
Eschner et al.

[11] Patent Number: 5,469,056
[45] Date of Patent: Nov. 21, 1995

[54] PLANAR GRADIOMETERS ARRANGED ON NON-PARALLEL SURFACES FOR DETERMINATION OF A GRADIENT TENSOR OF A MAGNETIC FIELD

[75] Inventors: Wolfgang Eschner, Daisendorf, Germany; Wolfgang Ludwig, Taegerwilen, Switzerland

[73] Assignee: Dornier GmbH, Germany

[21] Appl. No.: 656,416

[22] Filed: Feb. 15, 1991

[30] Foreign Application Priority Data

Feb. 17, 1990 [DE] Germany ............................ 40 05 079.3

[51] Int. Cl.⁶ ...................... G01R 33/022; G01R 33/035
[52] U.S. Cl. ...................... 324/248; 324/247; 324/260; 505/846
[58] Field of Search ........................... 324/247, 248, 324/249, 260, 345; 128/653.1; 505/845, 846

[56] References Cited

U.S. PATENT DOCUMENTS

| | | | |
|---|---|---|---|
| 4,386,318 | 5/1983 | Burbank et al. | 324/225 X |
| 4,646,025 | 2/1987 | Martin et al. | 324/346 |
| 4,771,239 | 9/1988 | Hoenig | 324/248 |
| 4,982,157 | 1/1991 | Seifert | 324/248 |
| 5,049,813 | 9/1991 | Dössel et al. | 324/248 |

FOREIGN PATENT DOCUMENTS

| | | | |
|---|---|---|---|
| 0275767 | 7/1988 | European Pat. Off. | 324/247 |
| 3247543 | 6/1984 | Germany . | |
| 0261847 | 11/1988 | Germany | 324/248 |
| 0187267 | 8/1987 | Japan | 324/248 |
| 0131083 | 6/1988 | Japan | 324/248 |

OTHER PUBLICATIONS

Wynn et al; "Advanced Superconducting Gradiometer/Magnetometer... Signal Processing Technique," IEEE Trans. on Mag., vol. Mag–11, No. 2, Mar. 1975, pp. 701–707.
Czipott et al; "Use of a Superconductive Gradiometer in an Ultrasensitive . . . Metal Detector", IEEE Trans. on Mag., vol. 25, No. 2, Mar. 1989, pp. 1204–1207.

*Primary Examiner*—Gerard R. Strecker
*Attorney, Agent, or Firm*—Ralf H. Siegemund

[57] ABSTRACT

At least five planar gradiometers on at least three non-parallel surfaces are used to determine five, linearly independent components of a gradient tensor of a magnetic field.

8 Claims, 1 Drawing Sheet

PLANAR GRADIOMETERS ARRANGED ON NON-PARALLEL SURFACES FOR DETERMINATION OF A GRADIENT TENSOR OF A MAGNETIC FIELD

BACKGROUND OF THE INVENTION

The present invention relates to a device for determining the five linearly independent components of a gradient tensor of a magnetic field.

For measuring completely the components of a magnetic gradient tensor it is required in principle that spatial changes in the magnetic field have to be measured in the direction of the areal normal or right angle axis of a transducer or receiver coil that is to be responsive to a magnetic field. For this it has been proposed to use three dimensionally arranged and constructed coil arrangements and devices. For example for measuring the gradient tensor wound wire coils are used as shown e.g. by M. W. Wynn et al published in IEEE Trans Mag, Mag-11.2, 1975 or a three dimensionally coating technology is used as shown e.g. in German patent 32 47 543 A1. The calibration of the magnetometer is typically carried out by means of auxiliary devices as shown in the Wynn et al publication above, or numerically or electronically as shown e.g. by P. V. Czipott, and W. N. Podney published in IEEE Transactions Mag, Mag-25.2 1989.

Wound coils usually exhibit, in principle, relatively large errors. On the other hand planar coils can indeed be manufactured fairly simply in thin layer configurations. However, these configurations are sufficient only for measuring the nondiagonal elements of the gradient tensor. That means one can arrange two coils in the x-y plane to determine the gradient dBz/dx and dBz/dy. For the gradient dBz/dz the coils have to be arranged in two planes, one above the other. U.S. Pat. No. 4,646,025 describes such a device for measuring the diagonal elements; two coils are arranged in different planes one above the other. Two coils are arranged in the same plane for measuring the nondiagonal elements. Particularly the aforementioned coil arrangement, wherein one coil is placed above the other one, is very difficult to realize through planar elements. The thin layer technology on the other hand is very difficult to practice for any arrangement in three dimensional structures, including e.g. to extend coatings across edges or the like.

DESCRIPTION OF THE INVENTION

It is an object of the present invention to provide a new and improved equipment for determining the five linearly independent components of a gradient tensor in a magnetic field avoiding the aforementioned difficulties.

In accordance with the preferred embodiment of the present invention it is suggested to realize the object by arranging at least five gradiometers in three or more planes which do not extend parallel to each other whereby each gradiometer includes at least two field detectors or transducer coils which are in one plane. By way of preference the gradiometers are arranged on the planes of a polyhedron with a plurality of nonparallel surfaces; by way of example a pyramid with three surfaces is of great interest. However pyramids having five or six surface segments are preferred. In the case of five pyramidal surfaces the inclination angle should be 32 degrees or 58 degrees and for a six sided pyramid, the angle should be 27 degrees or 63 degrees. Also, one can use tetraida, an octoida, a dodecaida, or an icocida.

The gradiometers themselves could be of the squid type. Each surface should be provided with a magnetometer, in addition to the gradiometer, for determining the magnetic field component transversely to the respective surface; the magnetometer may also be of the squid type. The inventive arrangement of multiple planar gradiometers does permit the complete acquisition through numerical process of all components of the tensor. One needs at least five planar gradiometers with at least three non-parallel surfaces but, large numbers of course will increase the accuracy.

The invention has the following advantage. In the case of a planar arrangement each gradiometer when integrated with a magnetometer on the same plane permits optimization of calibrated calculation for the elimination of any imbalance errors. A very important point of the invention is that wound coils, with their great susceptibility to errors, are avoided. Likewise, complicated coating methods where e.g. superconductive connections have to be drawn across edges, are not necessary.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding to the detailed description of the drawings FIG. 1 illustrates a squid magnetic field gradiometer G which includes two field receiving and detecting or transducing coils, S1 and S2 and a squid circuit for measuring the difference of the magnetic flux through the coils S1 and S2. In addition, there is a squid magnetometer. Reference characters MP1 and MP2 denote the respective centers of coils S1 and S2. Coupling the differential flux is carried out through the coupler coil AS.

Figure 1:
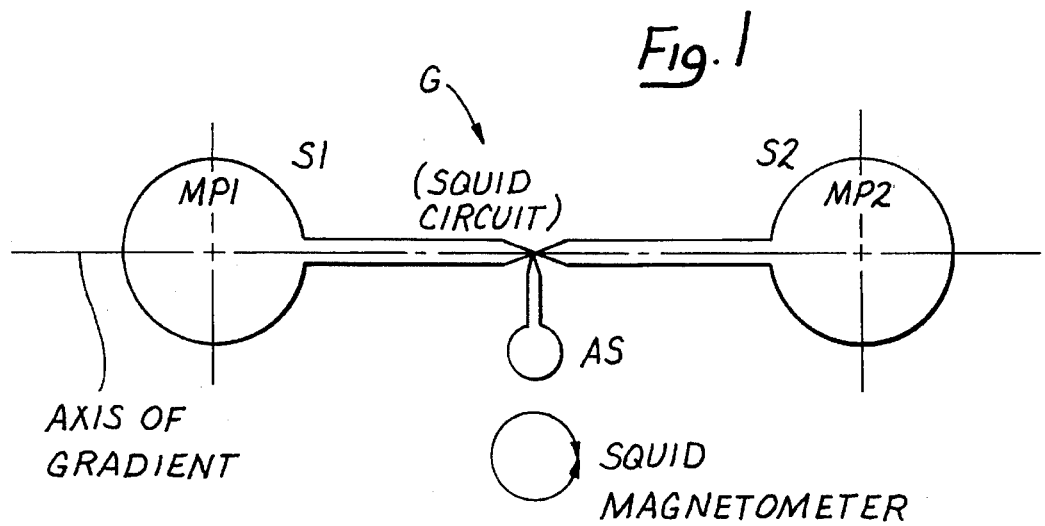
FIG. 1 illustrates a squid magnet field gradiometer.

Conceivable is the utilization of nonsuperconductive gradiometers wherein the two field receiver detectors and transducer coils S1 and S2 are situated in one plane and are in other words integrated in a planar chip. These meters would not include contrary to what is shown in FIG. 1, a coupler coil AS nor the squid magnetometer. They are sufficient to carry out measuring of component changes in the field transversely to the plane of the chip that is in the direction of MP1 and MP2 transverse to the plane of the drawings.

The gradient tensor is established on the basis of the Maxwell equations of electrodynamics and includes five independent components. Of these, three are nondiagonal elements and two are diagonal elements pertaining to a tensor matrix. Planar gradiometers can measure directly only the nondiagonal elements or components since there are at least five planar gradiometers in accordance with the present invention, the determination of all linear independent components of the gradient tensor can in fact be calculated in a simple fashion.

Figures 2, 2A:
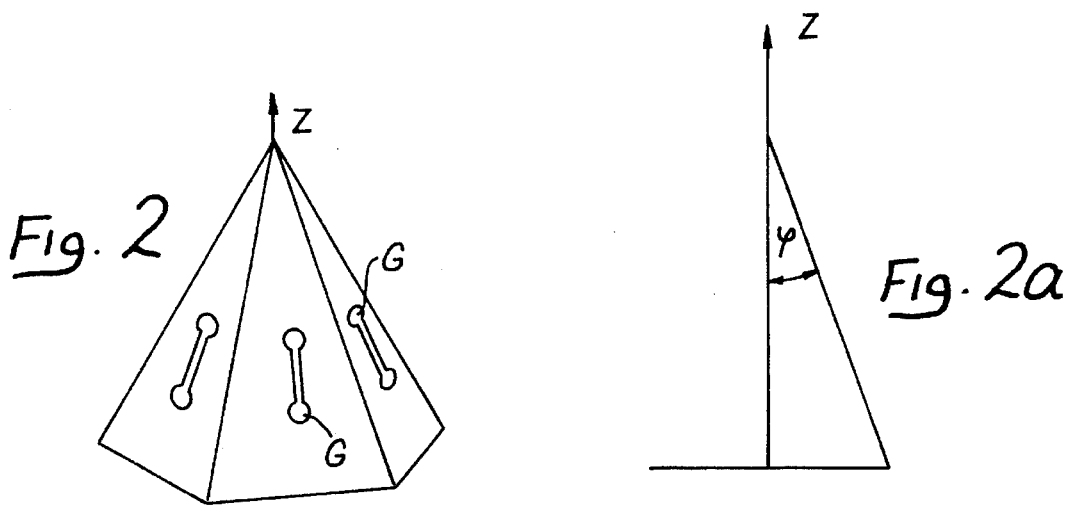
FIGS. 2,3 illustrate two geometric configurations by means of which the invention can be practiced with advantage in order to realize the preferred embodiment in a best mode configuration.
FIG. 2a illustrates a geometric detail.
Figure 3:
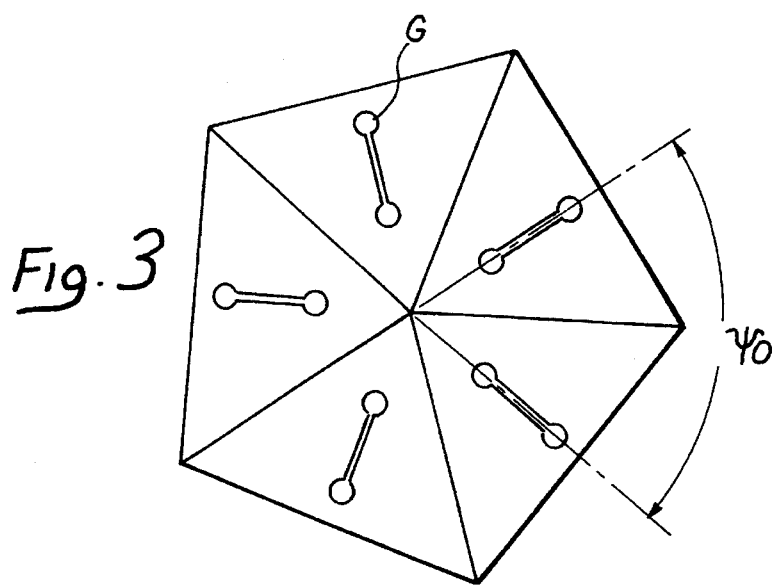

FIG. 2 illustrates a plurality of planar gradiometers G in a perspective view showing at least a six sided pyramidal arrangement, thus having a hexagonal base. FIG. 3 illustrates a pyramid with pentagonal base in top view.

The arrangements of FIGS. 2 and 3 permit the acquisition and, ultimately, the ascertainment of all five components in a gradient tensor of a magnetic field. The arrangement is composed of similar construction components. The arrangement consists of several, i.e. at least five similarly constructed gradiometers which are basically arranged on the pyramid surfaces, in a configuration of symmetry with regard to the z or vertical axis. In all cases there is a regular pyramid provided. Clearly, the utilization of similar components is a great advantage from the point of view of manufacturing.

The inventive gradiometer shown in FIG. 2 and FIG. 3 may include squid magnetometers shown in FIG. 1, to include particularly a squid magnetometer in each pyramidal surface. These magnetometers are coplanar to the gradiometers in each instance, and they measure the field component transversely to the respective pyramid surface to which the respective associated gradiometer is attached. The measuring result can then be used directly for correcting errors in the measurement in an extremely accurate fashion such as unbalances of the gradiometers concerning homogenic magnetic field components. This simple way of correcting is not available with the usual gradiometers used for determining the diagonal tensor elements. Concurrently the magnetometers can determine the magnetic field vectors themselves.

The gradiometers are arranged so that the direction of differentiation points to the peak or apex of the respective pyramid. FIG. 2a shows particularly the geometric aspect involved namely the angle $\phi$ by means of which the respective pyramid surface is inclined in relation to the z or vertical or pyramid center axis. FIG. 3, moreover, illustrates the angle $\psi_o$ that is effective between two adjacent gradiometers, projected in a horizontal plane or transversely to the z axis. This is then specifically the angle between the respective MP1, MP2 axes for each of the gradiometer pairs.

In the case of a regular pyramid having five surfaces this angle $\psi_o$ would be 360 degrees/5=72 degrees. Signals $\Phi_i$ of the gradiometers can be processed as follows.

equation 1: $\Phi_i = \bar{f}_i^T \cdot \bar{\gamma} \cdot E$   i=1 ... m with E being the sensitivity of the gradiometer in cubic meters;

$\bar{\gamma}$ is a vector containing the components of the magnetic field gradient tensor $\Gamma$ with $$\bar{\gamma} = (\Gamma xx, \Gamma yy, \Gamma xy, \Gamma xz, \Gamma yz)$$

$\bar{f}_i$ are the geometric vectors $\bar{f}_i$ are the geometric vectors = ($\frac{1}{2}(1 + \cos^2\Psi_i)\sin2\phi$, $\frac{1}{2}(1 + \sin^2\Psi_i)\sin2\phi$, $\frac{1}{2}\sin2\Psi_i\sin2\phi$, $\cos\psi_i\cos2\phi$, $\sin\psi_i\cos2\phi$  $\Psi_i = (i - 1)\Psi_o$ and m is the number of gradients and planar gradiometers on the surfaces of the pyramid.

If m is five or larger, and the angle $\phi$ is not one of the following angles, 0, 45, 90, 135, or 180 degrees, then vectors $f_i$ are linearly independent and equation 1 can be inverted to read:

equation 2 $\bar{\gamma} = 1/E \, (\bar{f}_i)^{T-1} \, \bar{\Phi}$ wherein $\bar{\Phi}$ is the vector of the measuring signals $\Phi_i(\Phi_1, \Phi_2, \ldots \Phi_m)$ $\bar{f}_i^T$ is a matrix of the geometric vectors. i=1, 2, ... m $$\begin{array}{c} f_1^T \\ f_2^T \\ \cdot \\ \cdot \\ \cdot \\ f_m^T \end{array}$$

Thus, it is possible to extract all components of the gradient tensors from the measuring signals of the particular gradiometer arrangement assuming the conditions set forth above are observed.

The angle $\phi$ of inclination of the pyramid sides is optimized in fact for a five sided pyramid to be either 32 or 58 degrees; and for a six sided pyramid the angle $\phi$ of inclination should either be 27 degrees or 63 degrees.

For these angles the gradient tensor components to be measured are similarly composed of the measuring signals. Hence, the tensor components can be calculated from the measuring signal with the maximum accuracy that is possible. The imbalance correction of the gradiometer under utilization of the supplemental magnetometer providing measuring data $\Phi_{mag\ i}$ is carried out simply through the formation of the following differences.

Equation 3: $\bar{\Phi}_{corr} = \bar{\Phi} - \mu \cdot \bar{\Phi}_{mag}$ wherein $\bar{\Phi}_{corr}$ is a corrected gradiometer measuring signal vector $\bar{\Phi}$ is the uncorrected gradiometer measuring signal vector $\Phi_{mag}$ is the vector magnetometer-measuring signal U is the unbalance corrective factor.

The inventive arrangement can be used e.g. for the detection of magnetic anomalies as employed in the discovery of ore deposit, detection of the like or one can use them for diagnostic equipment for measuring magneto-encephalograms and/or magneto-cardiograms.

The invention is not limited to the embodiments described above but all changes and modifications thereof, not constituting departures from the spirit and scope of the invention, are intended to be included.

We claim:

1. Apparatus for determining five linear independent components of a gradient tensor of a magnetic field comprising, a plurality of at least five planar gradiometers arranged on at least three non parallel surfaces wherein each gradiometer includes at least two field detecting coils arranged in a common plane, being one of the at least three surfaces.

2. Apparatus as in claim 1, wherein the surfaces on which said gradiometers are arranged constitute the outer surfaces of a pyramid.

3. Apparatus as in claim 1, wherein said gradiometers are arranged on respective surfaces of a polyhedron.

4. Apparatus as in claim 1, wherein each two gradiometer coils are additionally associated with a magnetometer in that the magnetometer is arranged on the same plane as the two coils.

5. Apparatus as in claim 4, each magnetometer being of the squid variety.

6. Apparatus as in claim 1, said gradiometers including squid gradiometer structure.

7. Apparatus as in claim 2, wherein the pyramid is provided with five sides having a regular pentagonal base accordingly and an angle of inclination of each of the sides relative to the vertical being either 32 degrees or 58 degrees.

8. Apparatus as in claim 2, said pyramid having six sides, the pyramid having a regular hexagonal base accordingly and the angle of inclination of each surface relative to the vertical being 27 degrees or 63 degrees.

* * * * *